United States Patent [19]

Ohta et al.

[11] Patent Number: 5,660,519

[45] Date of Patent: Aug. 26, 1997

[54] METHOD FOR MOUNTING COMPONENTS AND AN APPARATUS THEREFOR

[75] Inventors: Hiroyuki Ohta; Hiroshi Sakurai; Kenichi Indo, all of Iwata, Japan

[73] Assignee: Yamaha Hatsudoki Kabushiki Kaisha, Iwata, Japan

[21] Appl. No.: 86,508

[22] Filed: Jul. 1, 1993

[30] Foreign Application Priority Data

| Jul. 1, 1992 | [JP] | Japan | 4-174328 |
| Aug. 4, 1992 | [JP] | Japan | 4-208284 |

[51] Int. Cl.⁶ ........................... H05K 13/00
[52] U.S. Cl. ............... 414/783; 29/743; 29/757; 901/35; 901/47
[58] Field of Search ................. 414/783, 787, 414/786; 801/17, 35, 40, 41, 47; 29/740, 743, 757

[56] References Cited

U.S. PATENT DOCUMENTS

| 4,305,130 | 12/1981 | Kelley et al. | 901/17 |
| 4,598,456 | 7/1986 | McConnell | 901/47 |
| 4,727,471 | 2/1988 | Driels et al. | 901/47 |
| 4,762,578 | 8/1988 | Burgin, Jr. et al. | 29/740 |
| 4,893,183 | 1/1990 | Nayar | 901/47 |
| 4,910,859 | 3/1990 | Holcomb | 901/41 |
| 4,973,216 | 11/1990 | Domm | 901/47 |
| 5,088,187 | 2/1992 | Takata et al. | 29/740 |
| 5,105,528 | 4/1992 | Soth et al. | 901/41 |
| 5,154,316 | 10/1992 | Holcomb et al. | 29/740 |
| 5,278,634 | 1/1994 | Skunes | 356/400 |

FOREIGN PATENT DOCUMENTS

| 0416878 | 3/1991 | European Pat. Off. . |
| 0471272 | 2/1992 | European Pat. Off. . |
| 9214988 | 9/1992 | WIPO . |

OTHER PUBLICATIONS

European Search Report dated Feb. 25, 1994.

*Primary Examiner*—Karen B. Merritt
*Assistant Examiner*—Gregory A. Morse
*Attorney, Agent, or Firm*—Knobbe, Martens, Olson & Bear LLP

[57] ABSTRACT

A method and apparatus for mounting components comprising at least one pick up device carried by a carriage and adapted to pick up a component and bring it into registry with a sensing device for sensing the component and oriented it. The device operates so that the sensing operation is performed during the movement of the pick up device so as to speed up the operation. Embodiments are shown wherein a plurality of pick up devices are carried by the same carriage and various feeders arrangements are disclosed so as to permit simultaneous pick up of a plurality of components.

44 Claims, 16 Drawing Sheets

METHOD FOR MOUNTING COMPONENTS AND AN APPARATUS THEREFOR

BACKGROUND OF THE INVENTION

This invention relates to a method and apparatus for mounting components and more particularly to an improved method and apparatus for moving components from a feed area and appropriately positioning the components at a mounting area.

In many types of assembly apparatus, it is desirable to pick up a component from a delivery station, move it to a mounting station and mount it on a substrate such as a printed circuit board or the like. With such apparatus, it is desirable that the apparatus can move at a high rate of speed in order to produce the requisite assemblies at a low cost. The time during which the component is transported from its picked up location to its deposited location is, in effect, lost time with most apparatus.

It is, therefore, a principal object of this invention to provide an improved method and apparatus for moving components between one location and another and performing an operation on the components when they are being transported.

By way of example, a wide variety of apparatus have been proposed for picking up small components such as IC's, resistors, condensers or the like and positioning them for mounting on a substrate such as a printed circuit board or the like. In order to permit accurate mounting of the component, the orientation of the component relative to the pick up device once it is picked up must be determined. Normally the components are presented to the pick up device at a station and frequently the components are mounted in recesses on a tape or the like. As such, it is not accurately known what the position of the component is relative to the pick up device when the component is picked up.

Thus, considering the "X","Y" axes and the rotational position θ about the axis of the pick up device, it is necessary to measure the correction factors both in the "X" direction, in the "Y" direction and the rotational position of the component relative to the pick up device when the component is picked up. Various measuring devices have been proposed for this purpose.

The disadvantage of necessitating separate measurements is that the measurements all take time and, therefore, the previously proposed devices have been relatively slow in operation.

It is, therefore, a principal object to this invention to provide an improved method and apparatus for determining the correction necessary for a component that is picked up by a gripping device so that it can be accurately positioned.

It is a further object to this invention to provide an improved method and apparatus for determining the position of a component that is picked up by a pick up device.

It is yet a further object to this invention to provide an improved method and apparatus for determining the correction necessary for a component during the time period when the component is being transported between its picked up location and its deposited location.

Devices of the type previously described have generally been configured so as to handle only a single component at a given time. However, the device can be much more expeditiously constructed and operated if a plurality of components may be transported simultaneously. Although this simultaneous transportation is desirable, it is also desirable if certain processes can be performed on the components when they are being transported and this can give rise to difficulties in that there may be interference between the respective components during the time period when they are being transported.

It is, therefore, a still further object to this invention to provide an improved apparatus for transporting a plurality of picked up components and performing an operation on all of those components during the time when they are transported.

For example, it has already been noted that it is desirable to provide a mechanism for sensing the orientation of the components. Quite advantageously, this can be done during the time when the components are being transported. However, if a sensing device is employed it is desirable to insure that all transported components may be sensed at the same time or during the same movement.

It is, therefore, a still further object to this invention to provide an improved component handling device wherein a sensing arrangement is provided that is adapted to sense the condition of a plurality of components all being transported at the same time.

When a device is provided for accommodating the sensing of a plurality of objects during their transportation and the sensing device is of the optical type, it is desirable to insure that there is an offset between the components and the sensing device so that each component can be sensed without interference from the others. This offsetting can be accomplished by either staggering the pick up device and/or the sensing device. However, when this staggering is done then the pick up devices may be located or oriented in such a way that they cannot pick up or deposit articles simultaneously. This can considerably slow down the operation.

It is, therefore, a still further object to this invention to provide an improved article handling device wherein a plurality of components may be sensed during their transportation and yet the pick up devices and the feeders for them are oriented so as to permit simultaneous pick up and or delivery.

SUMMARY OF THE INVENTION

A first feature of this invention is adapted to be embodied in a method and apparatus for handling components and positioning the components. The apparatus comprises a pick up device for picking up, transporting and depositing articles between a delivery up area and a deposit area. Means support the pick up device for movement between the areas. In accordance with an apparatus incorporating the invention, means are provided for performing an operation on the component during the movement. In accordance with a method of using such an apparatus, an operation is performed on the component during its movement by the pick up device.

Another feature of the invention is adapted to be embodied in a method and apparatus for handling a plurality of components, which apparatus comprises a carriage that is supported for translatory movement and a plurality of pick up devices each adapted to pick up, transport and deposit a respective component and which pick up devices are supported by the carriage. A sensing device is carried by the carriage in proximity to the pick up devices and components carried thereby for sensing a condition of the components carried by the pick up device. In accordance with an apparatus performing this invention, the sensing device is disposed at an angle to the pick up devices so that all components can be sensed at the same time. In accordance with a method for practicing the invention, the sensing device is oriented relative to the pick up devices so that all components can be sensed while being transported.

A further feature of the invention is adapted to be embodied in a component handling apparatus for handling a plurality of components that comprises a carriage supported for translatory movement and a plurality of pick up devices each adapted to pick up, transport and deposit a respective component and which pick up devices are supported by the carriage. Feeder sections are provided for feeding components to be picked up by the pick up devices and the feeder sections and pick up devices are oriented so as to permit simultaneous pick up of a plurality of components, each by a respective one of the pick up devices.

DETAILED DESCRIPTION OF THE PREFERRED EMBODIMENTS OF THE INVENTION

Figure 1:
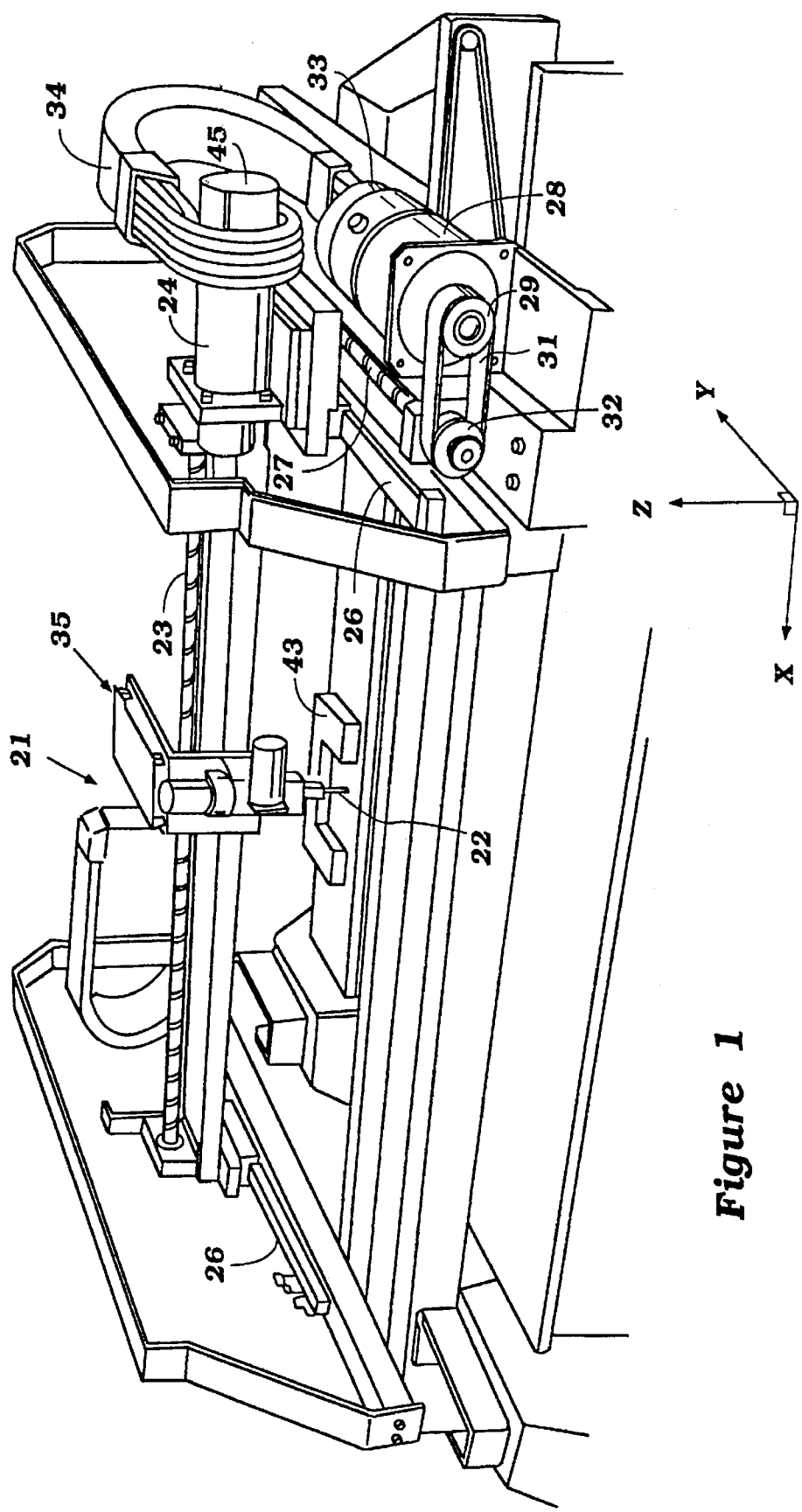
FIG. 1 is a perspective view of a component mounting apparatus constructed and operated in accordance with an embodiment of the invention.
Figure 2:
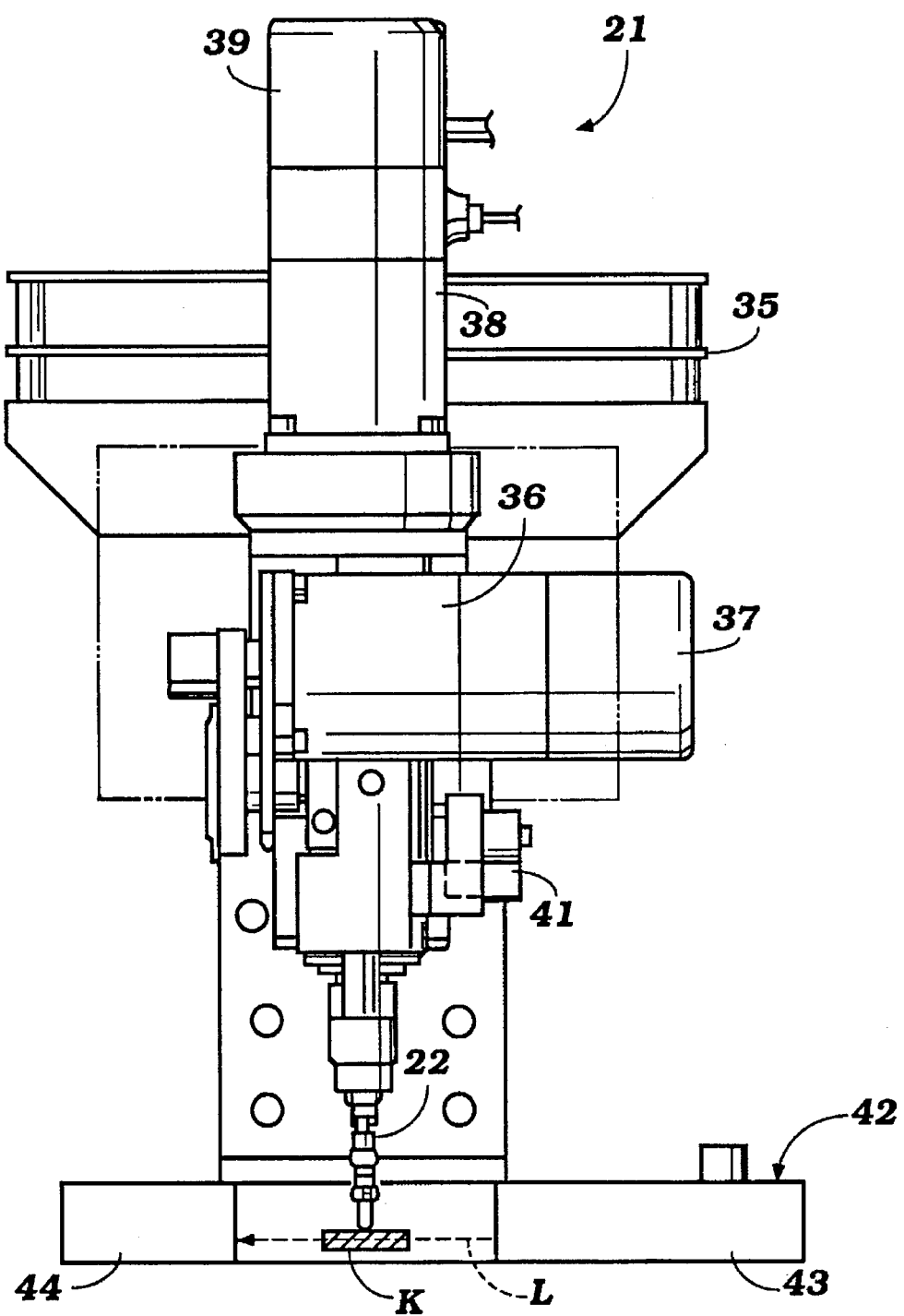
FIG. 2 is an enlarged side elevational view showing the apparatus when a component has been picked up and is positioned in the measuring station.
Figure 3:
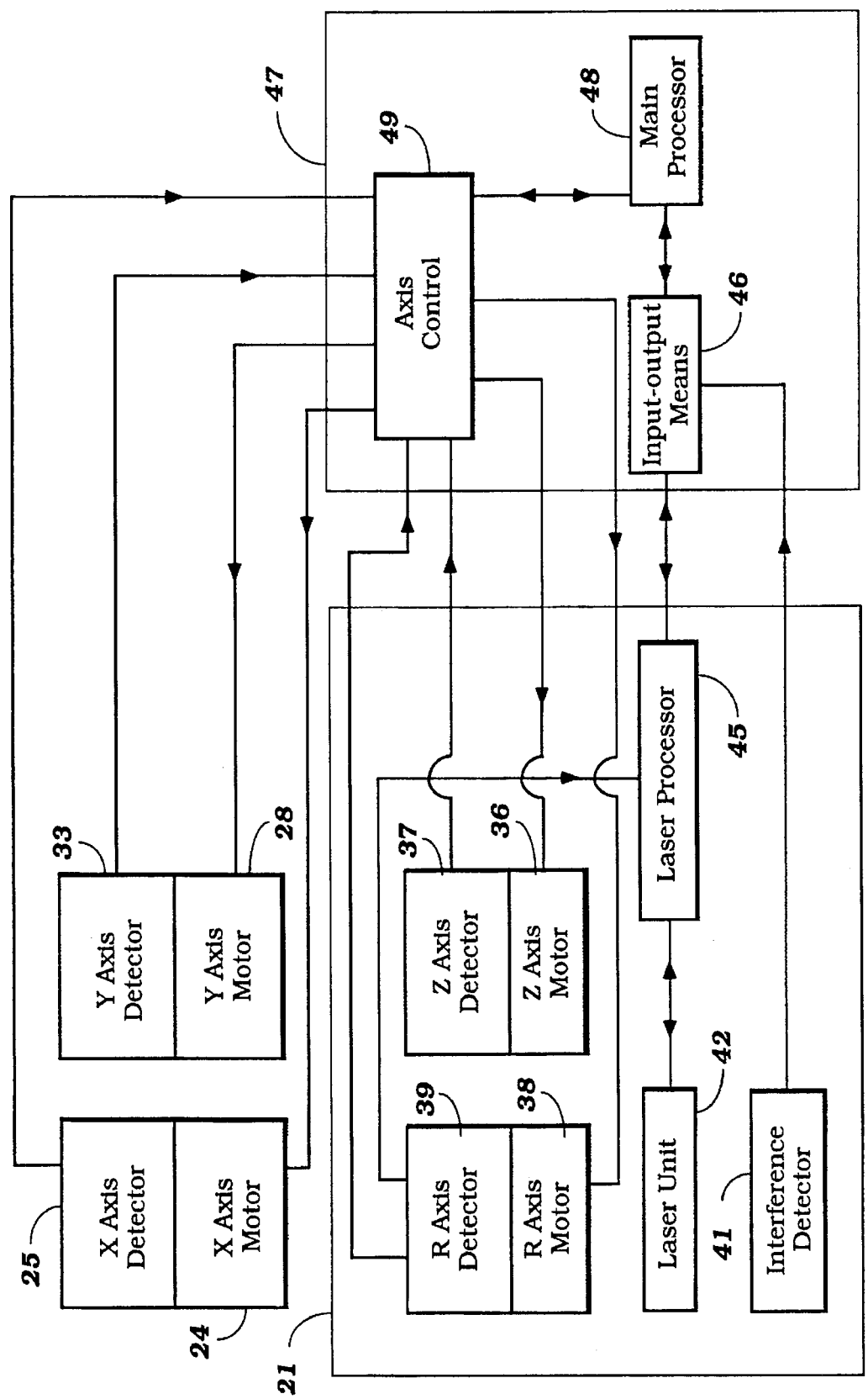
FIG. 3 is a block diagram showing the various components of the apparatus and their interrelationship.

Referring now in detail to the drawings and initially to FIGS. 1 through 3, a component mounting apparatus is comprised of a component pick up head 21 that has a pick up nozzle 22 of the vacuum type for picking up small components to be mounted on a substrate such as a printed circuit board or the like. The pick up head 21 may be of the vacuum type but it is to be understood that this invention can be employed with a wide variety of other types of pick up devices.

The pick up head 21 is supported upon a carriage, to be described, for movement in the "XX" direction along a feed screw 23 which is driven by a servo motor 24. A suitable support for the pick up head 21 is provided for this purpose. A position sensing device such as a encoder 25 is coupled to the servo motor 24 and provides a signal indicative of the position of the pick up head 21 in the "XX" direction.

The "XX" drive and pick up head 21 as thus far described, are moveable as a unit in the "YY" direction along a pair of guide rails 26 that are positioned at the end of the apparatus. A feed screw 27 drives the assemblage comprised of the "XX" drive and pick up head 21 in the "YY" direction. A servo motor 28 has a driving sprocket 29 which drives a belt 31 to drive a driven sprocket 32 affixed to the end of the feed screw 27. Hence, operation of the servo motor 28 and the drive moves the pick up head 21 in the "YY" direction. A position sensor such as a encoder 33 is coupled with the servo motor 28 so as to provide a signal indicative of the "YY" position of the pick up head 21.

A flexible conduit 34 contains the power controls for the servo motor 24 and the drives, to be described, for the pick up head 21 so as to permit the transmission of electrical power to the pick up head 21 when it moves in the "YY" direction.

Referring now in detail primarily to FIGS. 2 and 3, the pick up head 21 includes a carriage 35 on which the pick up nozzle 22 is supported for movement both in an axial direction along the "ZZ" axis and for rotary motion about an axis coincident with the pick up nozzle 22 and identified as the "R" axis.

Movement in the "ZZ" direction is controlled by a servo motor 36 that drives the pick up nozzle 22 between its lowered and raised positions and which is coupled to an encoder or position sensing device 37 so as to determine the location of the pick up nozzle 22 in the "ZZ" direction. Rotary motion about the "R" axis is accomplished by means of a servo motor 38 which is coupled to the pick up nozzle 22 to rotate it about the "R" axis. An encoder 39 is coupled with the servo motor 38 so as to provide a position signal indicative of the angular position θ about the "R" axis.

Two further sensor mechanisms are carried by the pick up head 21. These include an interference detector 41 which is operative to provide an signal when the pick up nozzle 22 has moved along the "ZZ" direction until a position clear of the where articles have been picked up so as to permit movement of the pick up head 21, as will be described.

As a further sensor, there is a provided an optical measuring device, indicated generally by the reference numeral 42 which includes a laser light source 43 that emits a plurality of parallel light rays along line "L" as shown in FIG. 2 and in FIGS. 7 through 9 and 11 which are obstructed by the picked up component, indicated at "K" on a photodetector 44 such as a CCD. As may be seen in FIG. 3, the laser unit 42 is connected to a laser processor 45 that outputs and receives signals from an input/output means 46, for a purpose which will be described.

Referring now specifically to FIG. 3, the system is provided with a main controller, indicated by the reference numeral 47 which includes in addition to the input/output means 46, a main processor 48 that provides the control sequence which will be described. This main processor 48 controls the transmission of signals from the input/output means 46 and the interference detector 41 and also provides axis control to an axis controller 49 which will set the various positions of the components, as will now be described.

Figure 4:
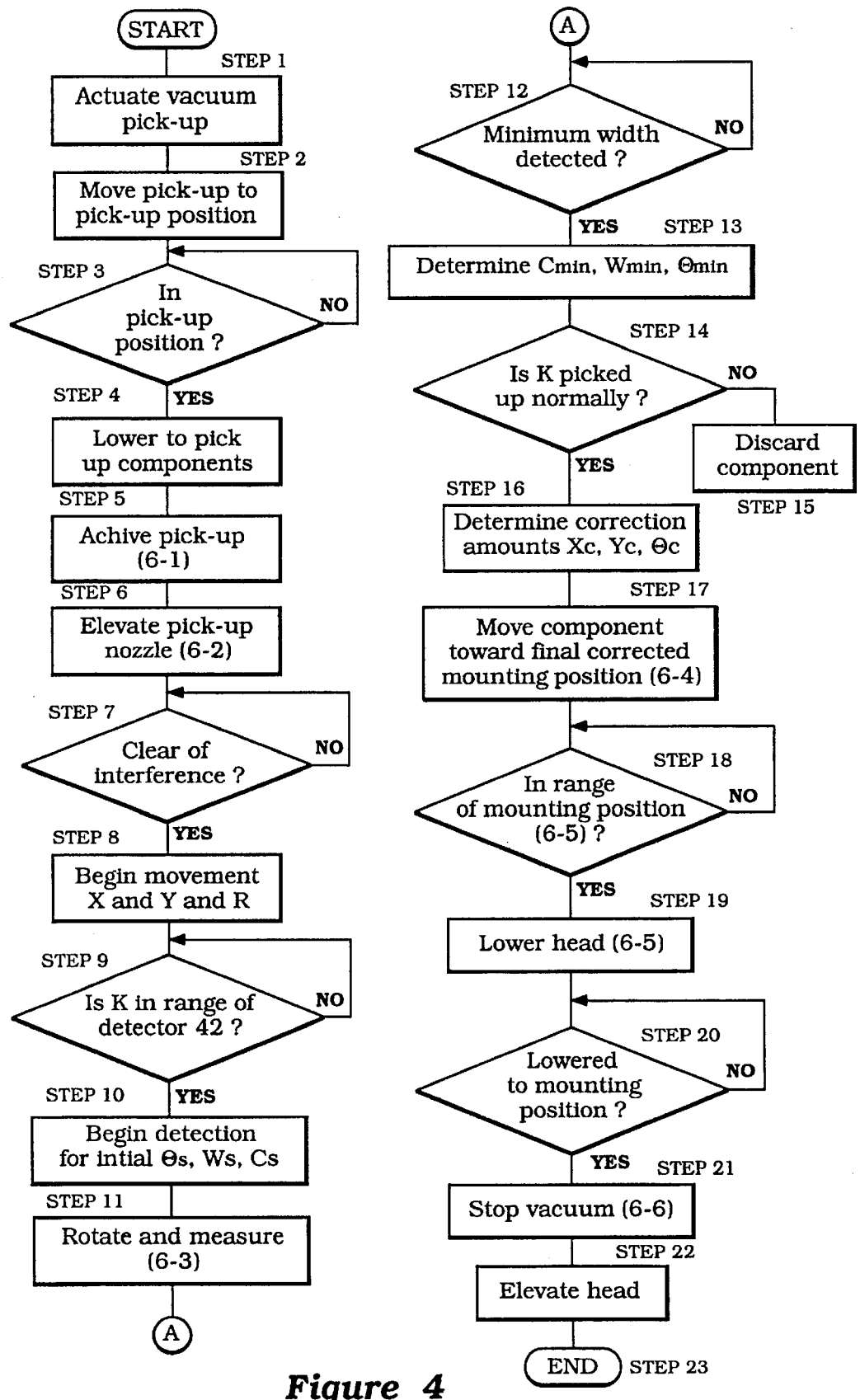
FIG. 4 is a block diagram showing the control routine in accordance with a method by which the apparatus operates.

The method by which the apparatus operates so as to pick up components and position them appropriately on the substrate will now be described by particular reference to FIGS. 4 through Referring initially to FIG. 5, this is a top plan view and shows the apparatus during a particular pick up and mounting mode. As may be seen, on opposite sides of the apparatus, there are provided pairs of feeder stations 51 and 52 where components to be mounted are fed. These feeder stations 51 and 52 may generally be comprised of tape feeders 53 which present small components to be picked up by the pick up head 21 and specifically the pick up nozzle 22, moved to an appropriate position and oriented so as to be mounted on a substrate (not shown) carried on a table or conveyor belt positioned between the feeder stations 51 and 52.

It should be noted that the components fed at the stations 51 and 52, although being generally oriented in a certain relationship, are not accurately positioned in the necessary orientation. That is, the components normally contained in pockets in a tape and although those pockets are sized so as to orient the components "K" in a particular relationship, the components may be at different angular positions about an angle θ relative to the axis "R" of the pick up nozzle 22 and also displaced along the "X" and "Y" axis from the rotational axis "R" and center of the pick up nozzle 22.

Therefore, the device functions so as to pick up the components from the feeder tapes 53 and first determine the actual orientation of the point of pick up and the component relative to the nozzle. That is, the component may be picked up at an "XY" position that is offset from its center "G" relative to the center "O" of the pick up nozzle 22 for the individual component "K" as clearly shown in FIGS. 7 through 9 and 11. Hence, the device functions to provide certain measurements, as will be hereinafter noted, that permit the orientation to be determined and the necessary corrections made by the apparatus so that the components "K" can be accurately mounted.

This operation will now be described by reference to the block diagram of FIG. 4 and cross-reference to FIGS. 5 and 6 which show the path of travel during the pick up, orientation and mounting positions with the various points in this travel being indicated by the references numerals 1 through 6 in FIG. 5 and the corresponding positions being illustrated in the views of FIG. 6 (6-1 through 6-6). It should be noted that certain of the orders of operation of the steps which will be described by reference to FIG. 4 may be varied. These variations may be made without departing from the basic operation of the system and certain of these possible variations will be described. It is to be understood, however, that other variations may be possible.

When the program starts, it moves to Step 1 which, in accordance with one embodiment, starts the vacuum force to the pick up nozzle 22 so as to place the nozzle 22 in a condition that it will be capable of picking up components. The program then moves to the Step 2 where the axis control 49 is energized by the main processor 48 so as to move the pick up head 21 to a position above and adjacent the appropriate tape feeder 53. This is done by actuating the "X" and "Y" axes motors 24 and 28 so as to position the pick up head 21 in the appropriate location and also by actuating the "R" axis servo motor 38 so as to place the pick up head 21 in the desired rotational position prior to pick up. At the same time, the "Z" axis servo motor 36 will have been previously actuated so as to elevate the pick up nozzle 22 away from interference with the tape feeder 53. It should be readily apparent that the order of operation of the Steps 1 and 2 can be reversed.

The program then at the Step 3 confirms if the pick up head 21 is in the appropriate pick up position. If it is not, the program repeats.

If, however, at the Step 4 it is determined that the pick up head 21 is in a position wherein it is in the allowable range of picking up the components "K", then at the Step 4 the "Z" axis servo motor 36 is actuated so as to lower the pick up nozzle 22 an amount sufficient so that the nozzle 22 can pick up the component "K" contained in the feeder 53. This condition is also shown in view 1 of FIG. 6 (6-1).

It can be confirmed that the component is picked up by detecting the vacuum at the pick up nozzle 22 and once it is confirmed that the component "K" has been picked up, the "Z" axis servo motor 36 is again energized at the Step 6 so as to elevate the pick up nozzle 22. This initial pick up action is also shown in FIG. 6 (6-2).

The program then moves to the Step 7 where the interference detector 41 determines if the pick up nozzle 22 has been elevated sufficiently clear from the tape feeder 53 so as to begin movement of the pick up head 21. If the clearance is not reached, the program repeats.

When it is determined that the component "K" picked up by the pick up nozzle 22 is clear of the tape feeder 53, then the main processor 48 again actuates the axis control 49 so as to being movement from the pick up station in the "X" and "Y" directions toward the area where the component "K" will be mounted on the substrate. At the same time, the "R" axis motor 38 is actuated so as to provide an initial degree of rotation $\theta_s$ in a clockwise direction for the picked up component "K" and the pick up nozzle 22 (6-3). The reason for this will be described later.

The program then moves to the Step 9 so as to determine if the component "K" has been raised sufficiently so as to be in proximity to the detector 42. Once it is determined that the component "K" has been elevated into the detection range as shown in FIG. 6 (6-3), then the detecting operation is begun at the Step 10.

The method of measuring the location of pick up of the component "K" will now be described in addition by reference to FIGS. 7 through 11. As previously noted, the components "K" will be only roughly positioned at the pick up station where the pick up has occurred. Hence, the center of the pick up nozzle "O" will probably be displaced from the center "G" of the component "K". The angular position θ will also vary about the rotational axis "R".

In order to insure that the component is in a position other than its minimum width position when initially picked up, once pick up has been accomplished, the component is rotated so that it will be rotated clockwise through an angle $\theta_s$ from the initial angular position as determined by an arbitrary line "M" drawn through the center of the nozzle "O" which constitutes the θ=0 position.

Hence, this initial rotation through the angle $\theta_s$ will position the chip "K" in an angle $\theta_s$ so that when the light is emitted from the light source 43 to the light sensitive pick up 44, an area indicated as "$W_s$," which is equal to the width or length of the component "K" in a plane parallel to the "R" axis of the pick up nozzle will be occluded. When this measurement is taken, the center "G" of the component "K" will be displaced at a distance $C_s$ from a line "L" which forms the perimeter at one side of the measurement apparatus.

Figure 8:
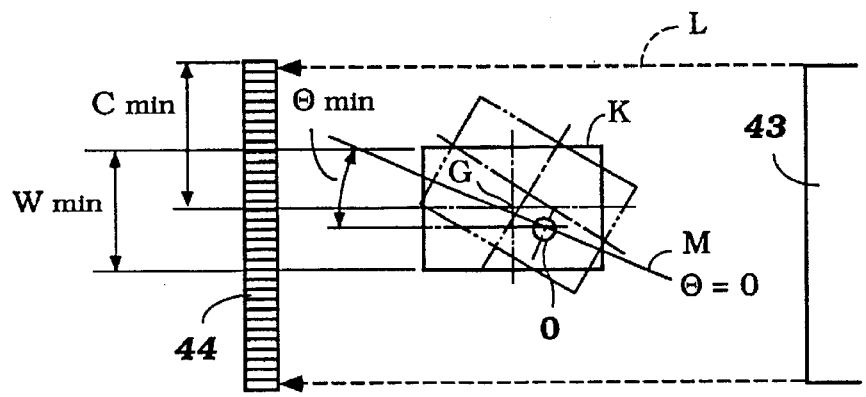
Figure 9:
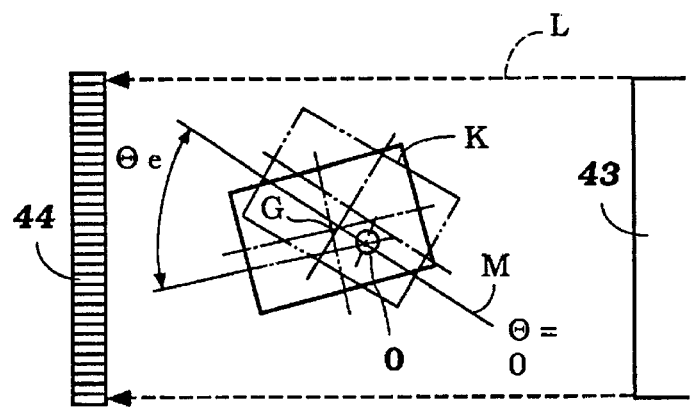

The pick up nozzle 21 is then rotated in a counter clockwise direction from the previous clockwise rotation through a position as shown in FIG. 8 where the minimum projected width $W_{min}$ is illustrated. At this point, it will be possible to determine the location of the center "G" at the mid point of $W_{min}$ and hence at a distance $C_{min}$ from the line "L". The rotation continues until a rotation through the predetermined angle $\theta_e$ has occurred as shown in FIG. 9.

Figure 10:
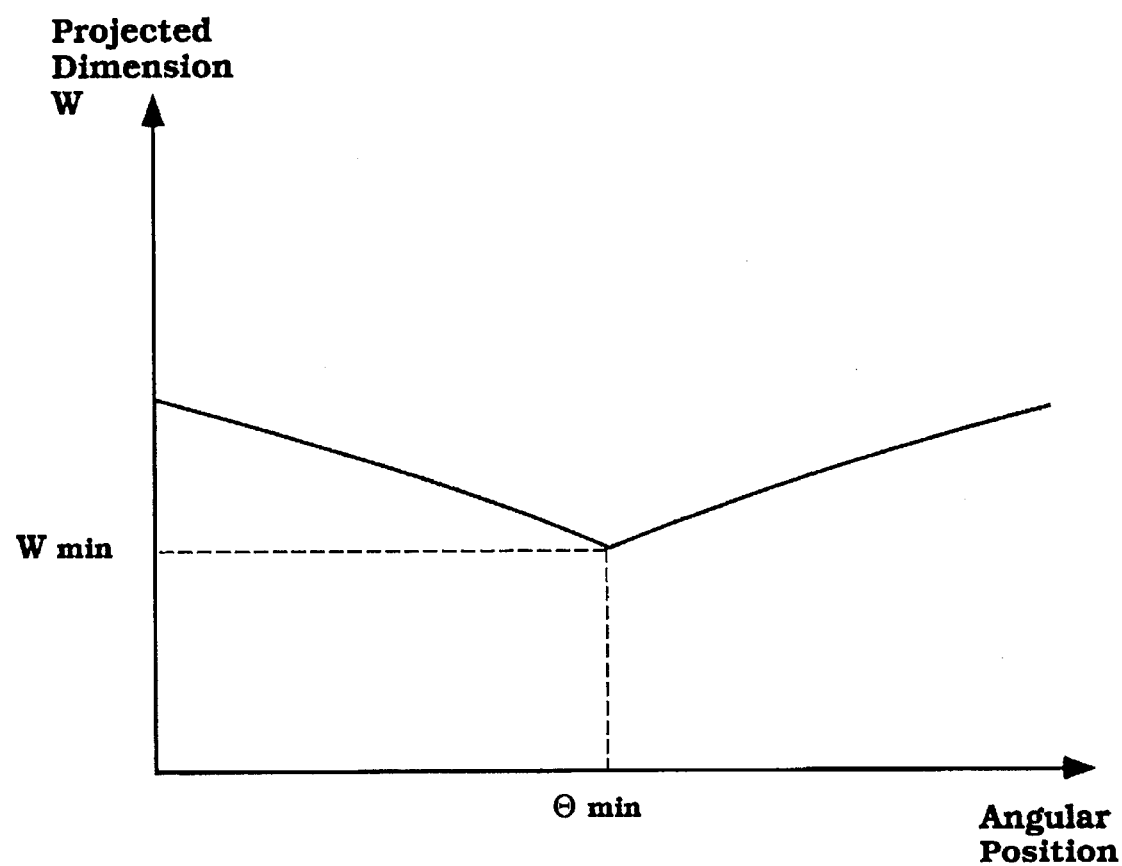
FIG. 10 is a graphical view showing the rotational position in accordance with FIGS. 7 through 9 and the effective projected length on the detector for the various angular positions.

FIG. 10 shows the way in which the projected width will vary with the $\theta_{min}$ position being that where the projected dimension "W" is at its minimum. The specific angle $\theta_e$ does not have to be a large angle and 45° is an appropriate angle so as to insure that the $W_{min}$ condition can be met.

Once the angular measurement necessary to determine the minimum width $\theta_{min}$ from the position $\theta_s$ has been determined and the width at the minimum width position $W_{min}$ and the initial width Wg have been measured, it will then be possible to determine the actual position of the pick up nozzle "O" relative to the center "G" of the component "K" both in the "X" and "Y" planes and also the angular relationship so as to determine the necessary correction factors in order to place the component "K" at the desired location and orientation on the substrate to which it is to be mounted.

Figure 14:
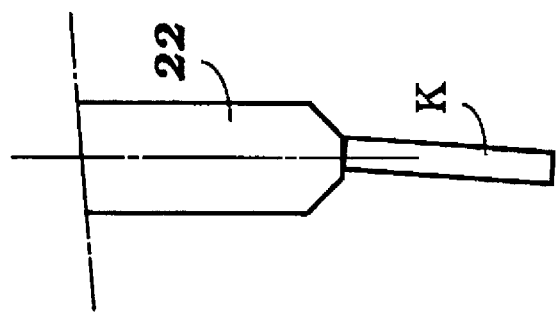
FIG. 12 through 14 are side elevational views of the relationship of the pick up to the picked up component and show either a correct pick up (FIG. 12) or various forms that an incorrect pick up may take (FIGS. 13 and 14).
Figure 13:
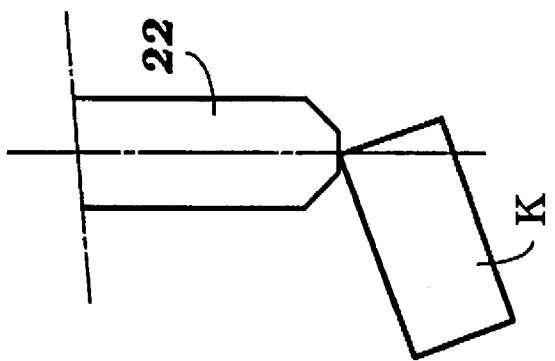
Figure 12:
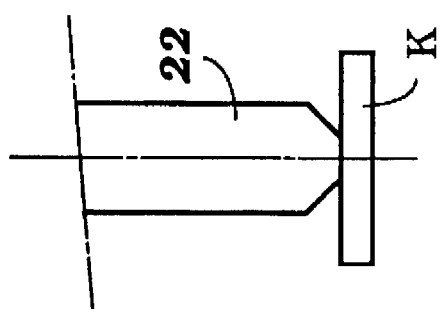

Before making these calculations, however, the program moves to Step 14 (FIG. 4) to determined if the component "K" has been appropriately attracted and is being held normally as shown in FIG. 12. It is possible that the component "K" could have been picked up in a misdirected orientation as shown in FIGS. 13 and 14 during the initial pick up. If at the Step 14 it is determined that the component "K" has not been appropriately pick up and is not in the orientation shown in FIG. 12, the program moves to the Step 15 to discard the picked up component. If, however, it has been determined at the Step 14 that the component "K" has been properly picked up, then the main processor 48 determines the necessary correction amounts "$X_c$, $Y_c$ and $\theta_c$" at the Step 16.

Figure 11:
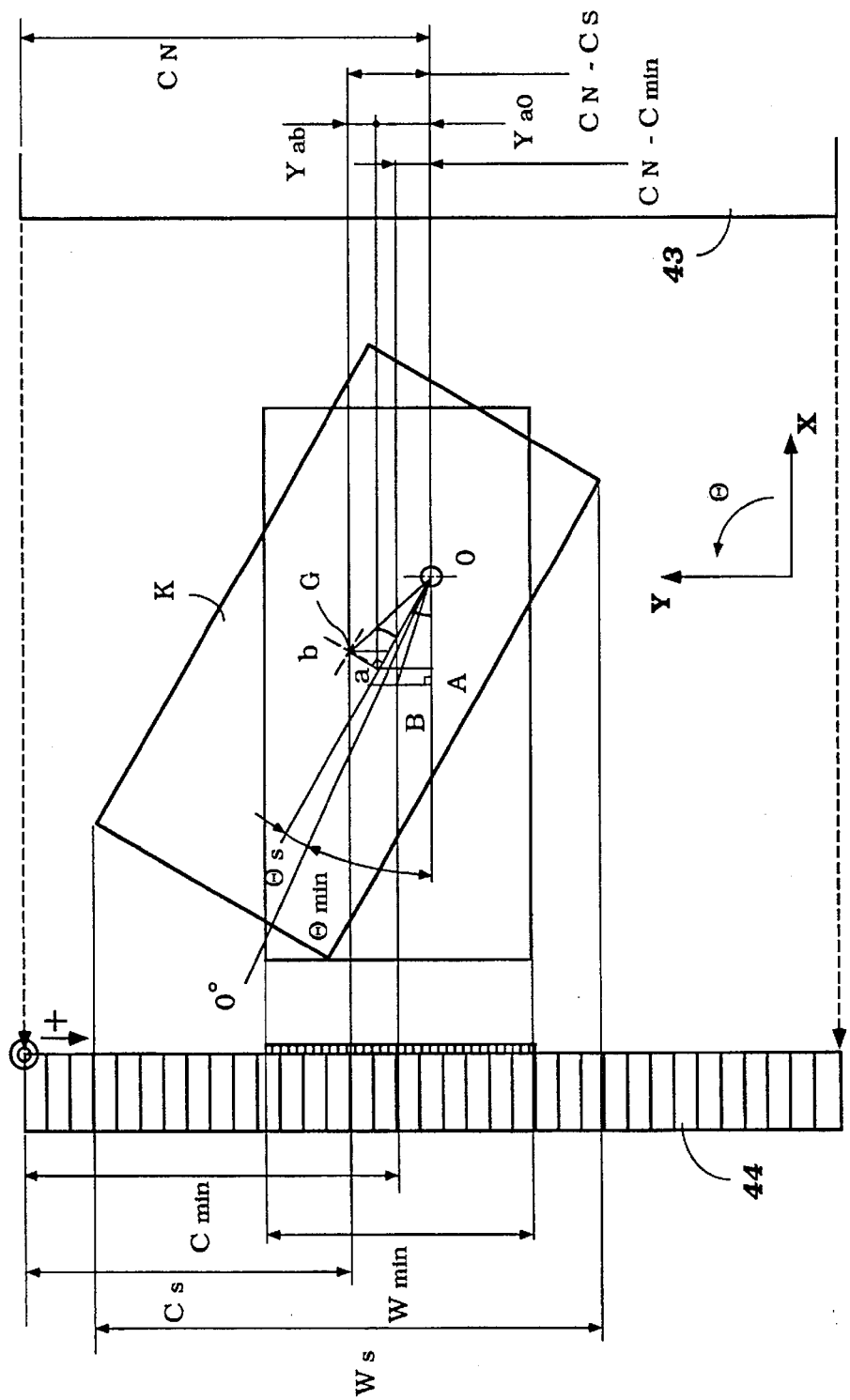
FIG. 11 is a further enlarged top plan view, in part similar to FIG. 8, and shows how the calculations for determining the correction factors are made.

These calculations may be best understood by reference to FIG. 11 which shows in solid line curves the $\theta_s$ position of the component "K" and its minimum width position. In this arrangement, the correction factors $Y_c$ and $\theta_c$ are easily determined in accordance with the following relationships:

$$Y_c = C_{min} - C_N$$

$$\theta_c = \theta_{min}$$

In these equations, $C_N$ is the center position of the attracting nozzle "O" as shown in FIG. 11 which is the distance from the edge of the measurement to the nozzle center which will be constant under all angular rotations Of the component "K". Hence, $C_N$ is a known factor and thus $Y_c$ is easily calculated since $C_{min}$ is easily calculated. Hence, the correction amounts $Y_c$ and $\theta_c$ are values that are obtained substantially by actual measurement and no real calculation is required.

The value of $X_c$ however does require calculations using the date $C_s$, $\theta_s$, $C_{min}$ and $\theta_{min}$ obtained by the detected figures. The basis for these calculations are as follows and again reference is made to FIG. 11.

We know that $\triangle AOB = \triangle aOb$. Thus, a b=AB=$C_N - C_{min}$. Thus the projected length $W_{ab}$ of the side a b on the "Y" axis (the plane of measurement) can be determined from the following relationship:

$$Y_{ab} = (C_N - C_{min}) \cos(\theta_{min} + \theta_s)$$

Similarly the projected length $Y_{ao}$ of the side "a o" on the measurement plane of the "Y" axis is obtained by the following equation:

$$\begin{aligned}Y_{ao} &= ao\sin(\theta_{min} + \theta_s) \\ &= (C_N - C_s) - Y_{ab} \\ &= (C_N - C_s) - (C_N - C_{min})\cos(\theta_{min} + \theta_s)\end{aligned}$$

Therefore, the correction amount $X_c$ and the "X" axis direction can be calculated from the above equation by the following equation:

$$\begin{aligned}X_c &= AO = aO \\ &= \frac{(C_N - C_s) - (C_N - C_{min})\cos(\theta_{min} + \theta_s)}{\sin(\theta_{min} + \theta_s)}\end{aligned}$$

Once the correction factors are determined, and it is to be understood that this measurement is done while the pick up head 21 is being moved toward the final mounting position, the component continues to move to its final corrected mounting position at the Step 17. This final mounting position is adjusted using the corrective factors $X_c$, $Y_c$ and $\theta_c$ determined as aforenoted and FIG. 6-4 shows the movement in the corrected $\theta_c$ position.

Figure 5:
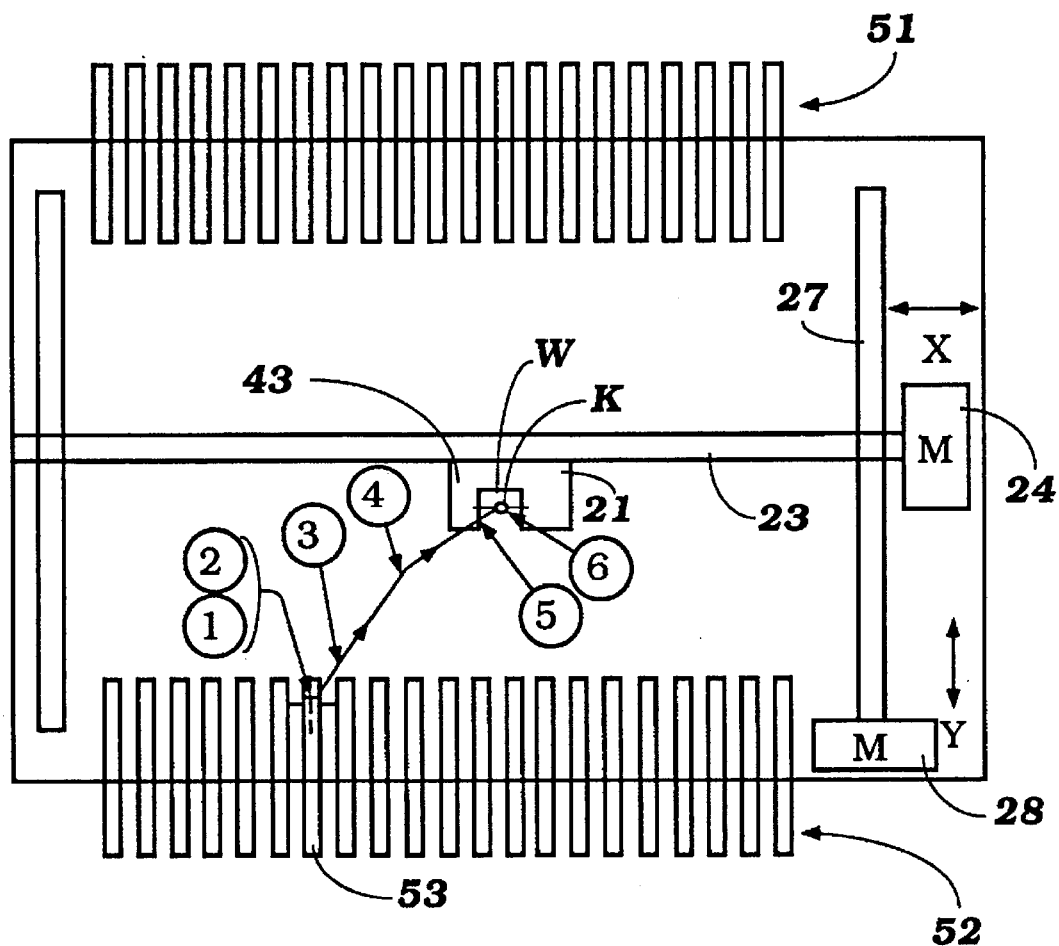
FIG. 5 is a top plan view of the apparatus and shows the path of movement between the picking up of a component at a feed station and the depositing of it in the desired location on a substrate such as a printed circuit board.
Figure 6:
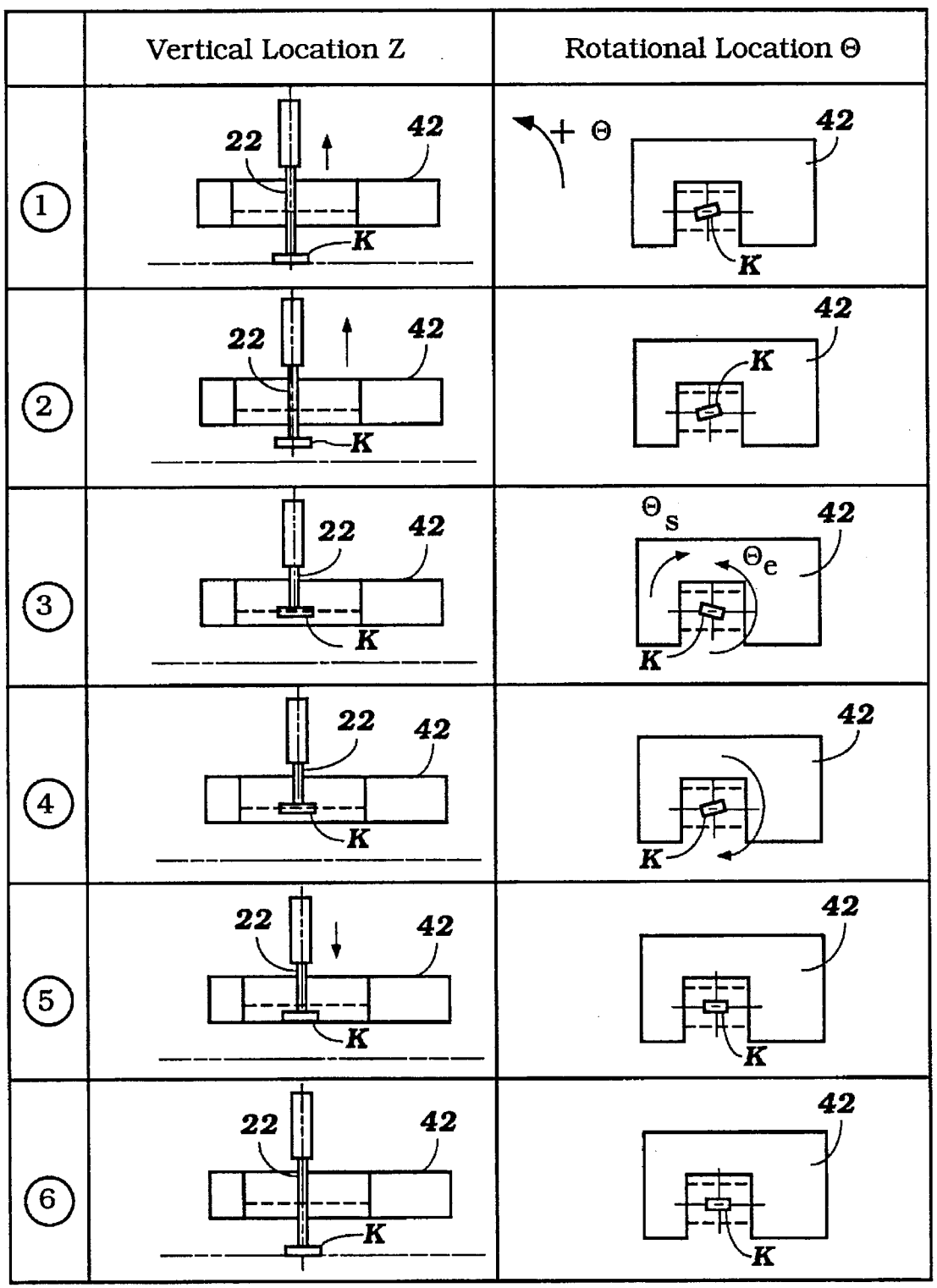
FIG. 6 is a series of views showing the vertical location of the apparatus and the rotary position of the component, respectively, at each of the locations 1 through 6 in FIG. 5.
Figure 7:
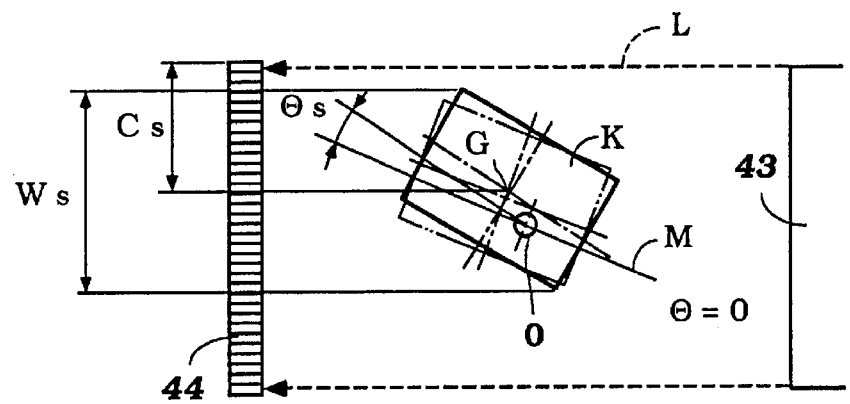
FIGS. 7 through 9 are top plan views, in part similar to the views 3 and 4 of FIG. 6 and shows the manner in which the measurements of projected length are obtained by the detecting apparatus.

The program then moves to the Step 18 to determine if the mounter head 21 and mounting component "K" is in the proper mounting position as shown at FIG. 6-5. If it is not, the program repeats. If, however, it is determined at the Step 18 that the mounting position is appropriately reached, then the "Z" axis servo motor 36 is energized so as to lower the pick up head 21 as shown also in FIG. 6-5 away from the detecting area 42.

At the Step 20 it is determined whether the pick up head 21 and specifically the component "K" has been lowered to the appropriate mounting position. If not, the program repeats. If, however, the pick up head 21 and component "K" have been lowered to the mounting position as show in FIG. 6-6, then the program moves to the Step 21 so as to discontinue the vacuum and deposit the piece "K" on the substrate.

Once the component "K" is released, the program moves to the Step 22 so as to elevate the pick up head 21 and pick up nozzle 22 so that the mounting operation is complete as the Step 23.

It should be readily apparent that the aforedescribed operation and apparatus permits very rapid mounting with minimum loss in time due to the fact that the correction amounts can be quickly calculated and also because of the fact that the correction measuring steps can be begun immediately after the unit begins to move upwardly so that the component "K" is clear of the pick up area and once the component "K" is in the sensing area 42. Of course, the foregoing description describes a mounting method wherein the minimum projected width or length $W_{min}$ of the component "K" is sensed. It is to be understood that the same method can be practiced by measuring the maximum projected width $W_{max}$ using very similar calculations.

The embodiment of the invention as thus far described, has only employed one pick up head 21 on the carriage 35. It should be readily apparent that the speed of the apparatus can be significantly increased if a plurality of pick up heads 21 are mounted on the carriage 35. The remaining figures illustrate several of such embodiments. However, the basic construction of the apparatus is the same as that previously described and, for that reason, components which are the same have been identified by the same reference numerals and will be described again only in so far as is necessary to understand the construction and operation of these additional embodiments.

Although it may be desirable to provide additional pick up heads 21 on the carriage 35, it is still desirable for cost and other reasons to use only one detecting section 42 for detecting the pick up components "K" and for calculating the corrections factors therefore. However, it is also desirable to provide a compact arrangement and this means that the detector 42 must be oriented relative to the pick up heads 21 and specifically the components carried by them so as to permit simultaneous reading of the positions of each of the individual components and the correction therefore. Obviously this means that the components "K" cannot be aligned with each other in the direction of the light rays "L".

FIGS. 15 through 18 show one way in which this may be done and as may be seen in the figures, the pick up heads 21 are staggered relative to the each other along the "XX" and "YY" axes rather than being aligned in the plane of either axis. This permits the detector 42 to be positioned in a normal orientation and as may be clearly seen in FIG. 15, this stagger of the pick up heads 21 is shown.

Figure 15:
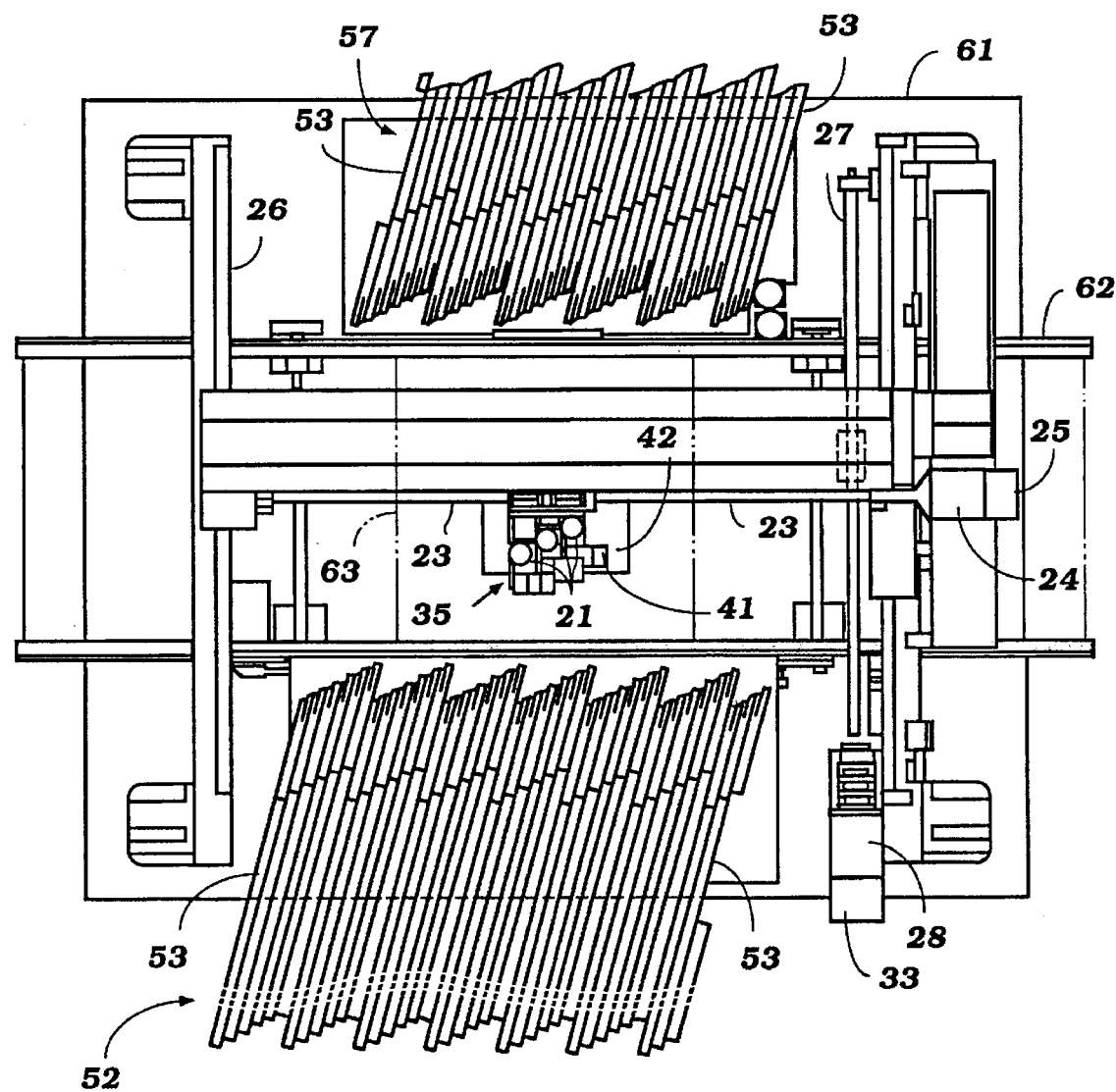
FIG. 15 is a top plane view of another embodiment of the invention showing the feeder stations in relation to the pick up assembly.
Figure 16:
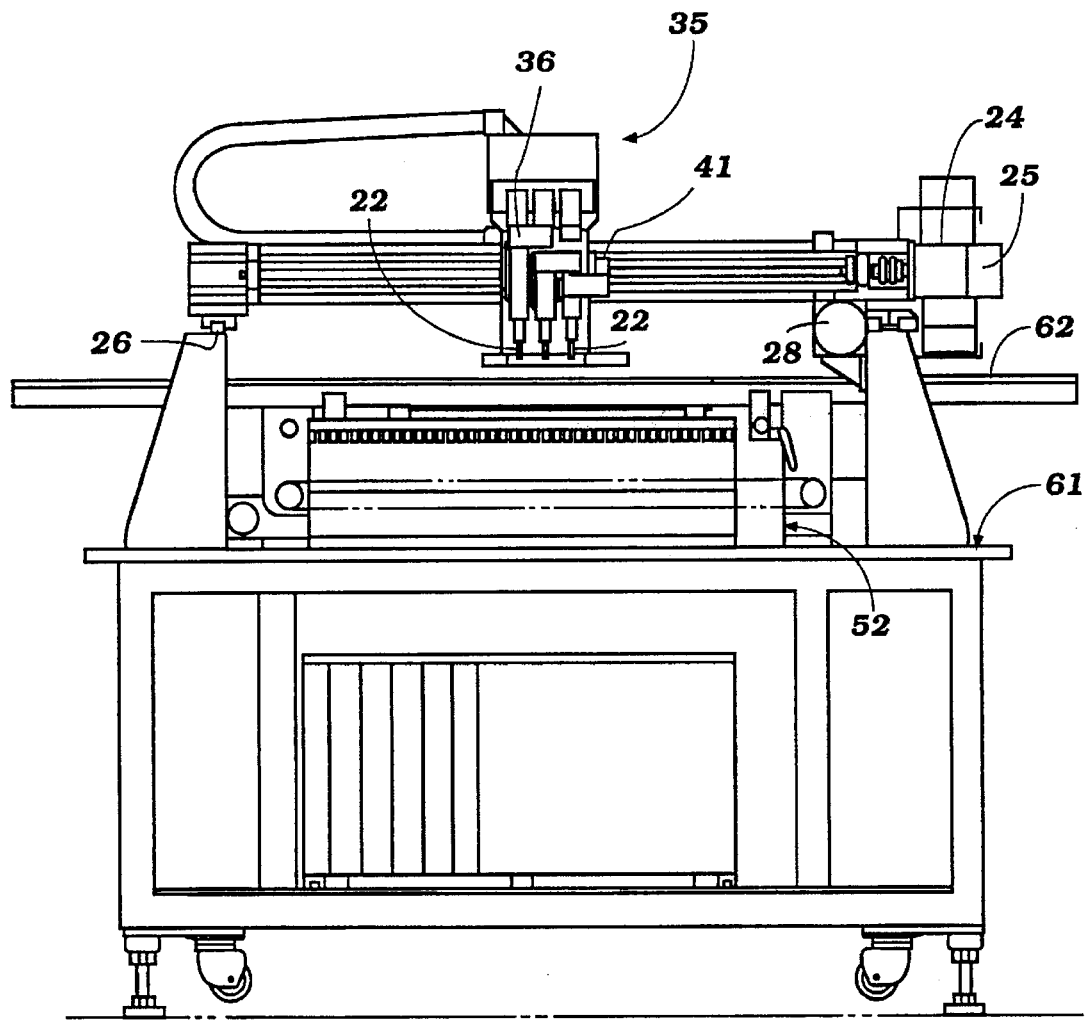
FIG. 16 is a front elevational view of the apparatus shown in FIG. 15.
Figure 17:
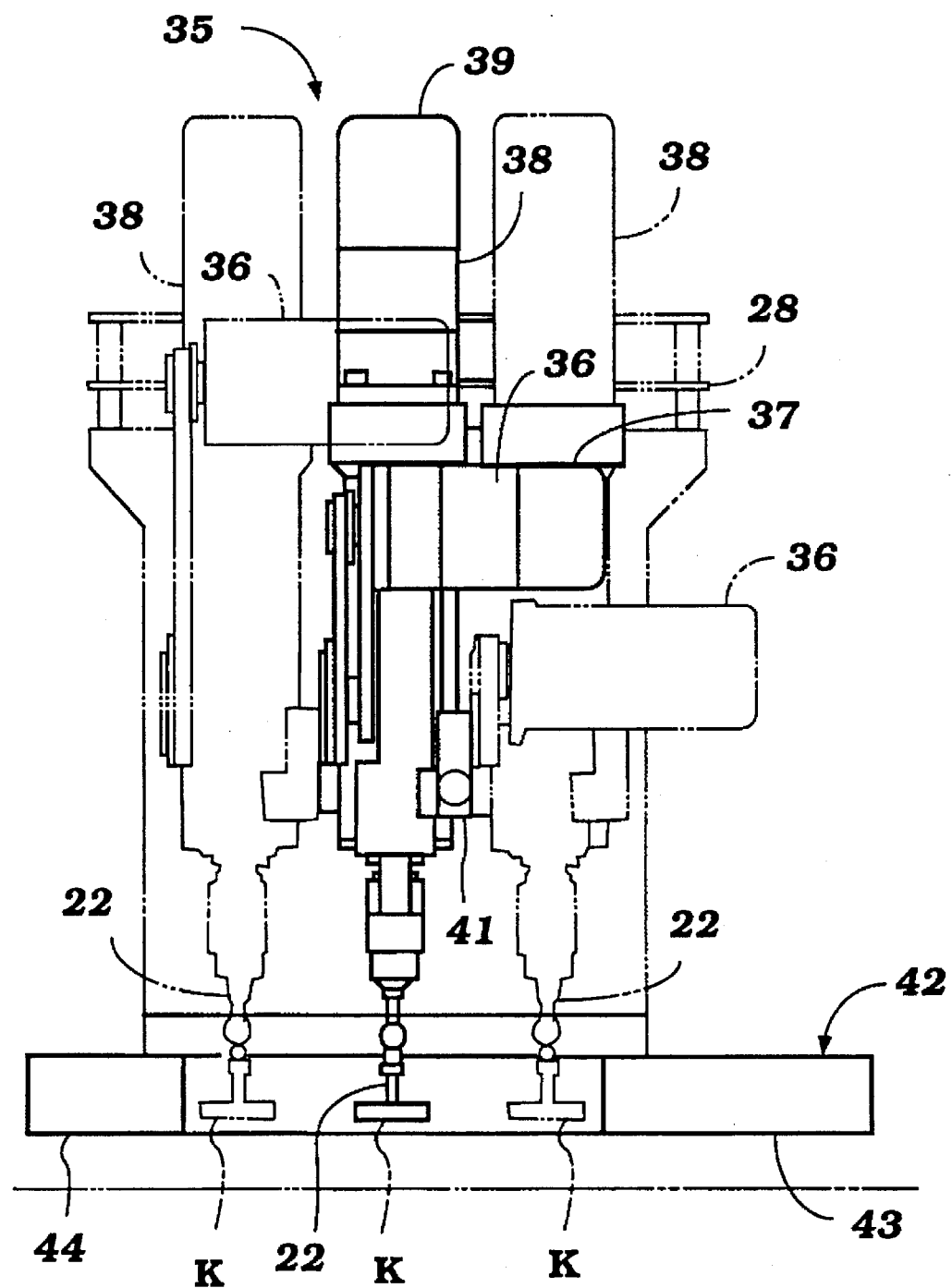
FIG. 17 is an enlarged front elevation view showing the pick up heads with one of the heads being shown in solid line and the added heads being shown in phantom.

It should be noted that FIG. 15, which corresponds generally to FIG. 5 of the previous embodiment, illustrates more details of the mechanism including the mounting table 61 along which are positioned a pair of tracks or guides 62 for a conveyor that conveys the substrates or printed circuit boards 63 to the mounting area between the feeders stations 51 and 52. Since the mounting heads 21 are staggered, as aforenoted, this means that it is desirable to also provide a corresponding stagger to the feeder sections 53 so that each pick up nozzle 21 may be disposed so as to simultaneously pick up a component "K" from the stations 51 and 52 if the components "K" are so oriented. However, because of the stagger, the components "K" will each be in a clear line of vision between the light source 43 and the CCD 44 so that all components can be recognized and oriented in the manner as described previously with the embodiments of FIG. 1 through 14. It should be understood that these detecting and orientation correction steps can be performed either simultaneously or sequentially.

Figure 18:
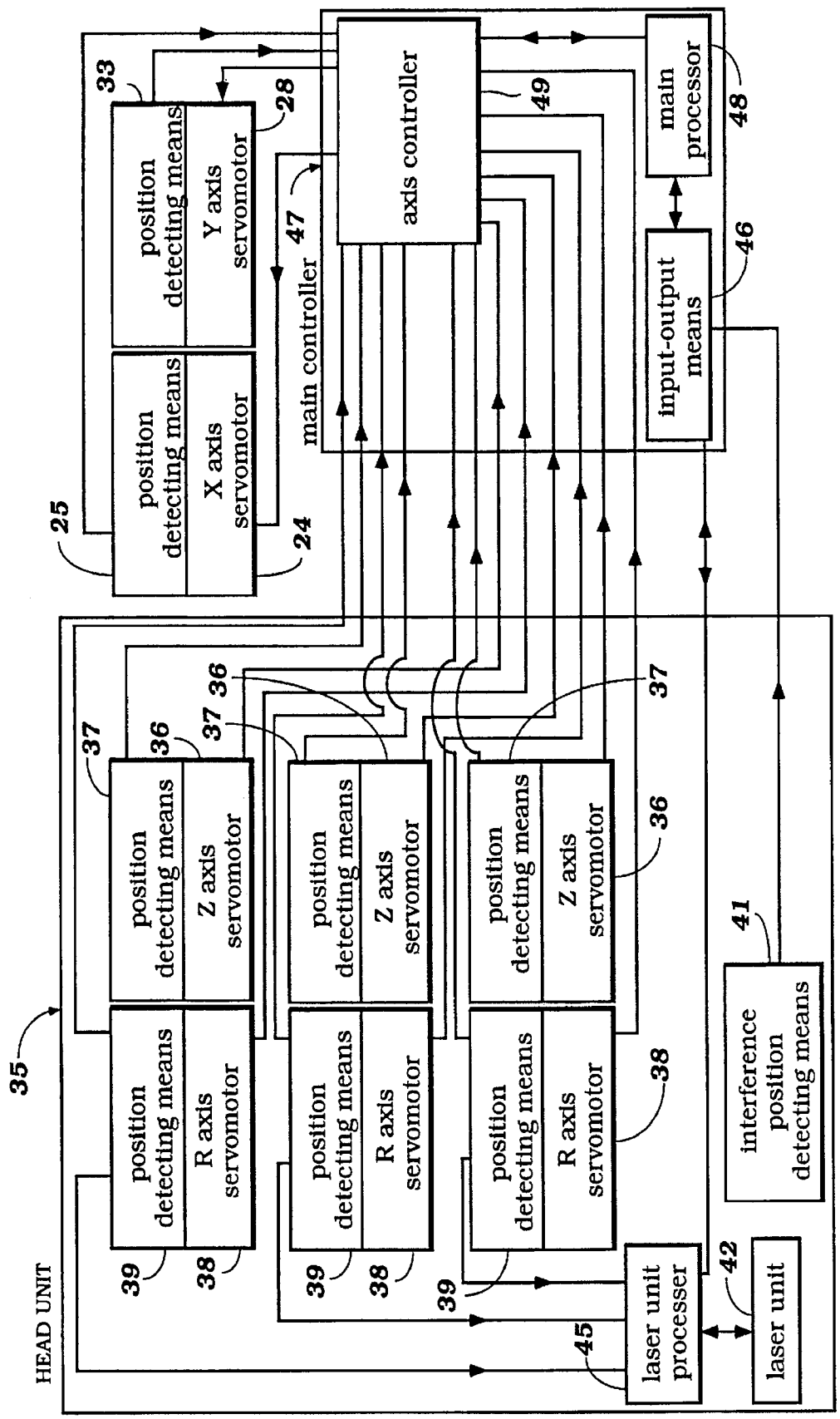
FIG. 18 is a block diagram, in part similar to FIG. 3, but illustrating the apparatus of this embodiment.

The block diagram of FIG. 18 shows how the three pick up heads 21 and their respective controls are incorporated on the head unit and carriage 35. It will be seen that the components are generally oriented the same as a single head system as shown in FIG. 3. Because of this similarity in construction, it is believed that a further description of this embodiment is not necessary to enable those skilled in the art to understand how the invention can be practiced in conjunction with this embodiment.

Figure 19:
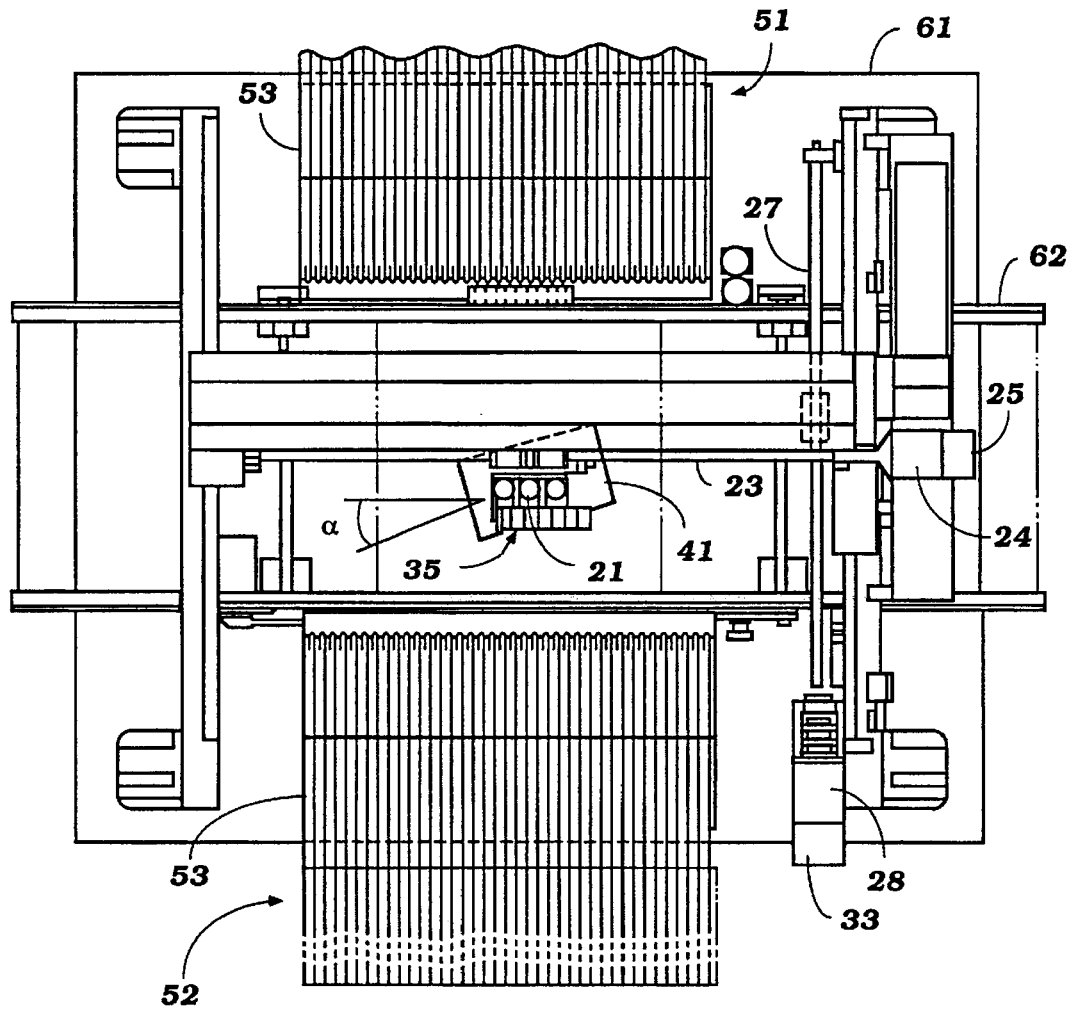
FIG. 19 is a top plan view, in part similar to FIG. 15, and shows another embodiment of the invention.

FIG. 19 shows another embodiment which achieves the same results as the embodiment of FIGS. 15 through 18. In this embodiment, however, the pick up heads 21 are all disposed in a line parallel to the "XX" axis and at the same distance on the "YY" axis. As a result, the detector 41 is rotated through an angle θ so as to achieve the same results as the staggering previously described. In this construction, therefore, the feeder tapes 53 may be oriented perpendicularly to the conveyor 62.

Figure 20:
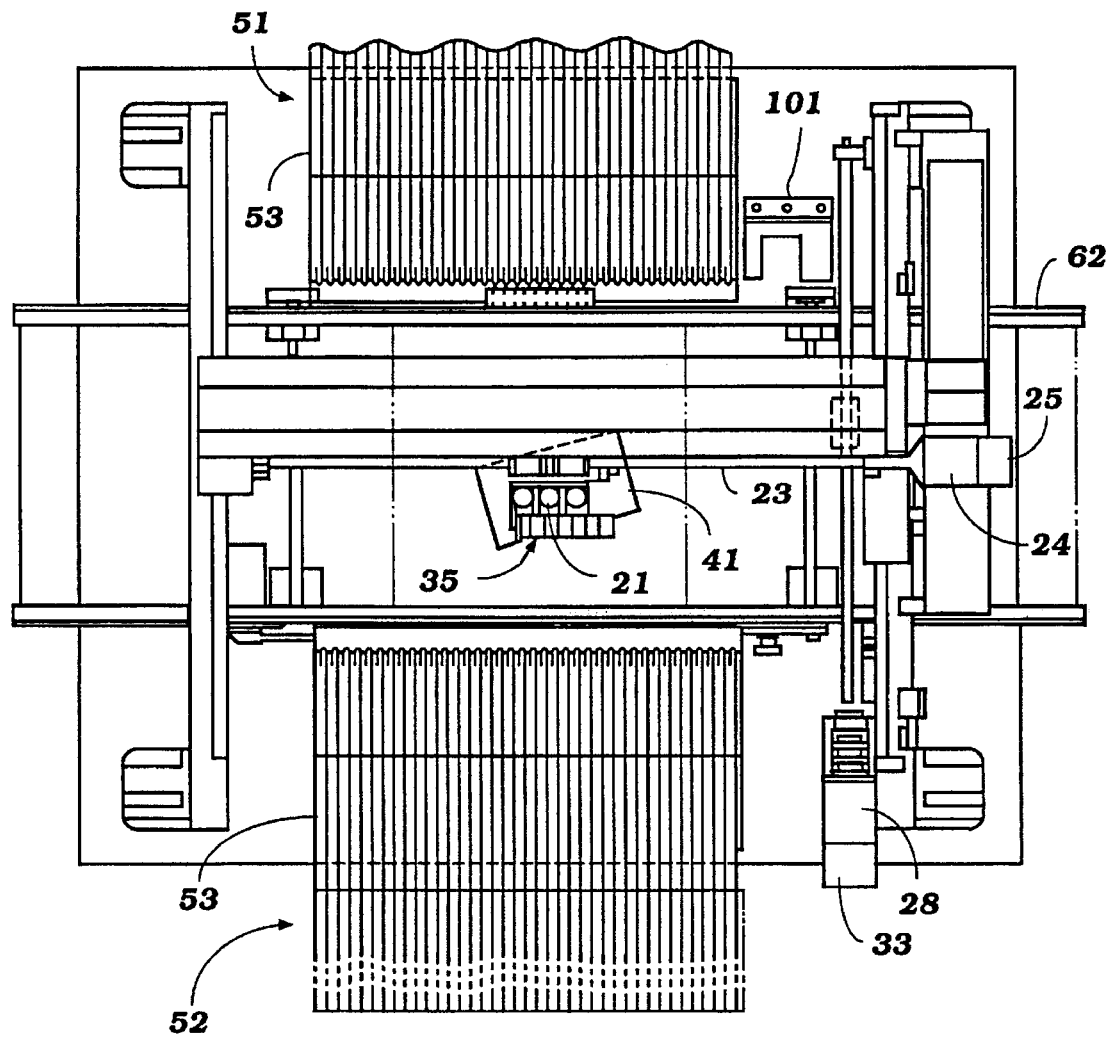
FIG. 20 is a top plane view, in part similar to FIGS. 15 and 19 and shows a further embodiment of the invention.

FIG. 20 shows another embodiment which is generally the same as the embodiment of FIG. 19. This embodiment differs from the previously described embodiment in providing a fixed detector section 101 which is mounted to one side of the conveyor 62 and, for example, adjacent the feeder section 51 so as to permit other sensing of the components by moving the carriage assembly 35 into this section 101. In all other regards, this arrangement works the same and has the same components as those previously described and, for that reason, further description of the construction and operation of this embodiment is not believed to be necessary to understand the construction and operation.

It should be readily apparent from the foregoing description that the described embodiments of the invention are extremely effective in permitting rapid handling of a plurality of components and permitting the orientation of the components and the determination of the components to be accomplished during the movement of the pick up head 21 from the pick up stations to the deposit stations. Of course, the foregoing description is that of preferred embodiments of the invention and various changes and modifications may be made without departing from the spirit and scope of the invention, as defined by the appended claims.

We claim:

1. A component handling apparatus for positioning components, said apparatus comprising a pick up device for picking up, transporting and depositing components between a pick up area and a deposit area, means for supporting said pick up device for movement between a lowered position in said pick up area for picking up a component from said pick up area to a raised transport position, for movement from said pick up area to said deposit area, and from said raised transport position to a lowered depositing position in said deposit area for depositing the component in said deposit area, means for sensing a condition of said component when in the raised transport position, and means for sensing when a component carried by said pick up device has cleared the pick up area and initiating rotation of said pick up portion thereafter.

2. A component handling apparatus as set forth in claim 1 wherein the means for sensing the condition of the component is mounted for movement with the pick up device during its movement from the pick up area to the deposit area.

3. A component handling apparatus as set forth in claim 2 wherein the means for sensing condition comprises an optical sensor.

4. A component handling apparatus as set forth in claim 3 wherein the optical sensor is effective to provide data for calculating the orientation in which the component is picked up by the pick up device.

5. A component handling apparatus as set forth in claim 4 wherein the orientation calculation is obtained from data determined from rotation of the component about an axis defined by the pick up device.

6. A component handling apparatus as set forth in claim 5 wherein the rotation is done initially in one direction and finally in the opposite direction.

7. A component handling apparatus as set forth in claim 6 wherein the rotation in the one direction is performed on the component during the movement from its lowered position wherein a component has been picked up and its raised position.

8. A component handling apparatus as set forth in claim 7 further including means for determining when the component has cleared the pick up area and for initiating the other operation thereafter.

9. A component handling apparatus as set forth in claim 2 wherein there are provided a plurality of pick up devices all carried by a common carriage for transportation between the pick up area and the deposit area and the means for sensing the condition senses each component carried by a respective pick up device.

10. A component handling apparatus as set forth in claim 9 wherein the means for sensing the condition comprises a single means for sensing the condition of all of the components.

11. A component handling apparatus as set forth in claim 10 wherein the means for sensing the condition comprises an optical sensor having an emitter emitting parallel light rays on one side of said pick up devices and a receptor on the other side of said pick up devices for receiving light not blocked by the components.

12. A component handling apparatus as set forth in claim 11 wherein the pick up devices are staggered at different distances from the emitter and spaced transversely relative to the light rays so that components carried by each of the pick up devices can be optically sensed at the same time.

13. A component handling apparatus as set forth in claim 12 further comprising a plurality of feeders for feeding components to the pick up area and wherein the feeders are offset in an opposite sense and direction to the offset of the pick up devices relative to the optical sensor.

14. A component handling apparatus as set forth in claim 3 wherein the optical sensor is fixed against movement relative to the pick up device.

15. A component handling apparatus as set forth in claim 14 wherein the operation involves rotating the component and the pick up device between a first position and a second position when the component is disposed in proximity to the optical sensor.

16. A component handling apparatus as set forth in claim 15 wherein the component and pick up device are rotated from a picked up position to the first position prior to positioning of the component in registry with the optical sensor.

17. A component handling apparatus as set forth in claim 16 wherein the rotation from the picked up position to the first position is in a direction opposite to the direction of rotation from the first position to the second position.

18. A component handling apparatus as set forth in claim 2 wherein the pick up device is supported for rotation relative to the means for sensing the condition.

19. A component handling apparatus for handling a plurality of components, a carriage supporting for translatory movement, a plurality of pick up devices each adapted to pick up, transport and deposit a respective component, said pick up devices being supported by said carriage for common movement, a single optical sensing device carried by said carriage in proximity to said pick up devices and components carried thereby for sensing a condition of all of said components carried by said pick up devices, and said optical sensing device being disposed at an acute angle to said pick up devices so that all components can be optically sensed at the same time without interference therebetween.

20. A component handling apparatus as set forth in claim 19 wherein the sensing device comprises a light source and a receptor to receive light waves passing said components.

21. A component handling apparatus as set forth in claim 20 wherein the pick up devices are all aligned in a plane of movement and the light rays emitted by said light source are dispersed at an acute angle to said plane so that all components can be sensed at the same time.

22. A component handling apparatus as set forth in claim 21 further including a plurality of conveyor devices for conveying components to a pick up area wherein components are picked up by the pick up devices.

23. A component handling apparatus as set forth in claim 22 wherein the conveyors devices are disposed in a line parallel to the plane of alignment of the pick up devices so that a component can be picked up from each conveyor simultaneously by the pick up devices.

24. A component handling apparatus as set forth in claim 19 wherein each of the pick up devices is supported for rotation about an axis relative to the carriage for the sensing operation.

25. A component handling apparatus as set forth in claim 24 wherein the optical sensing device comprises a light source and a receptor to receive light rays passing by said components.

26. A component handling apparatus as set forth in claim 25 wherein the pick up devices have their rotational axes all lying in a common plane and the light rays pass at an acute angle to said plane so that all components can be sensed at the same time.

27. A component handling apparatus as set forth in claim 24 wherein each of the pick up devices is supported for movement between a lowered pick up position and a raised transporting position.

28. A component handling apparatus as set forth in claim 27 wherein the optical sensing device is disposed contiguous to the raised position of the pick up devices so that components can be sensed when raised.

29. A component handling apparatus for handling a plurality of components, a carriage for supported for translatory movement, a plurality of pick up devices each adapted to pick up, transport and deposit a respective component, said plurality of pick up devices all being supported by said carriage, a single optical sensing device carried by said carriage in proximity to said pick up devices and components carried thereby for sensing a condition of all of the component carried by said pick up devices, and a plurality of feeders for transporting components to be picked up to a pick up station in proximity to the pick up devices when the carriage is positioned in registry therein.

30. A component handling apparatus as set forth in claim 29 wherein the pick up devices are all aligned in a plane and the optical sensor is disposed at an acute angle to said plane so that all components can be sensed at the same time.

31. A component handling apparatus as set forth in claim 30 wherein the sensor has a light source that emits parallel light rays and wherein the pick up devices are spaced at different distances from said light source.

32. A method for positioning components with an apparatus comprising a pick up device for picking up, transporting and depositing components between a pick up area and a deposit area, comprising the steps of moving the pick up device when in the pick up area from a transporting position to a pick up position, picking up a component from the pick up area with the pick up device, sensing when the component has cleared the pick up position while moving the pick up device toward the transporting position and initiating rotation of the pick up device thereafter, transporting the picked up component to the deposit area, and moving the pick up device and component from the transportation position to a deposit position for depositing the component at the deposit area.

33. A method as set forth in claim 32 wherein the condition is sensed in part by an optical sensor.

34. A method as set forth in claim 33 wherein the data from the optical sensor is used to calculate the orientation in which the component is picked up by the pick up device.

35. A method as set forth in claim 34 wherein the orientation measuring operation comprises rotation of the component about an axis defined by the pick up device.

36. A method as set forth in claim 35 wherein the rotation is done initially in one direction and finally in the opposite direction.

37. A method as set forth in claim 36 wherein at least a portion of the rotation in the one direction is performed on the component during the movement from its lowered position wherein a component has been picked up and its raised position.

38. A method as set forth in claim 37 further including determining when the component has cleared the pick up area and for initiating the rotational operation thereafter.

39. A method as set forth in claim 33 wherein the optical sensor is fixed against movement relative to the pick up device.

40. A method as set forth in claim 39 wherein the operation involves rotating the component and the pick up device between a first position and a second position when the component is disposed in proximity to the optical sensor.

41. A method as set forth in claim 40 wherein the component and pick up device are rotated from a picked up position to the first position prior to positioning of the component in registry with the optical sensor.

42. A method as set forth in claim 41 wherein the rotation from the picked up position to the first position is in a direction opposite to the direction of rotation from the first position to the second position.

43. A method as set forth in claim 32 wherein the pick up device is lowered to the pick up and depositing position and raised to the transporting position.

44. A method as set forth in claim 32 wherein the sensing of the condition is completed during movement of the pick up device to the deposit area.

* * * * *